(12) United States Patent
Abe et al.

(10) Patent No.: US 11,658,058 B2
(45) Date of Patent: May 23, 2023

(54) SUBSTRATE HOLDING APPARATUS

(71) Applicant: EBARA CORPORATION, Tokyo (JP)

(72) Inventors: Takahiro Abe, Tokyo (JP); Takuya Tsushima, Tokyo (JP); Tomonori Hirao, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 88 days.

(21) Appl. No.: 17/171,384

(22) Filed: Feb. 9, 2021

(65) Prior Publication Data
US 2021/0262109 A1 Aug. 26, 2021

(30) Foreign Application Priority Data

Feb. 20, 2020 (JP) .............................. JP2020-027355

(51) Int. Cl.
| | | |
|---|---|---|
| *B32B 43/00* | (2006.01) | |
| *H01L 21/683* | (2006.01) | |
| *H01L 21/687* | (2006.01) | |
| *H01L 21/677* | (2006.01) | |

(52) U.S. Cl.
CPC .... *H01L 21/6838* (2013.01); *H01L 21/67742* (2013.01); *H01L 21/68707* (2013.01); *B32B 43/006* (2013.01); *Y10T 156/1168* (2015.01); *Y10T 156/1179* (2015.01); *Y10T 156/1994* (2015.01)

(58) Field of Classification Search
CPC ............. B32B 43/006; Y10T 156/1132; Y10T 156/1168; Y10T 156/1179; Y10T 156/1994; Y10T 156/1998; H01L 21/6863
See application file for complete search history.

(56) References Cited

U.S. PATENT DOCUMENTS

| | | | | |
|---|---|---|---|---|
| 5,447,596 A | * | 9/1995 | Hayase | ............... H01L 21/6838 269/21 |
| 5,989,386 A | * | 11/1999 | Elliott | .................... G02B 21/32 156/707 |
| 10,272,661 B2 | * | 4/2019 | Chen | ....................... B24B 37/34 |
| 2011/0214805 A1 | * | 9/2011 | Brown | ................ H01L 31/1896 156/247 |
| 2012/0247685 A1 | * | 10/2012 | Burrows | ........... H01L 21/67346 156/764 |

(Continued)

FOREIGN PATENT DOCUMENTS

JP 2019-021725 A 2/2019

*Primary Examiner* — Philip C Tucker
*Assistant Examiner* — Nickolas R Harm
(74) *Attorney, Agent, or Firm* — BakerHostetler

(57) ABSTRACT

Provided is a substrate holding apparatus capable of appropriately holding a substrate. The substrate holding apparatus is suggested to hold a substrate including a portion to be plated that is exposed to a plating solution and an edge portion that is an area outside the portion to be plated. The substrate holding apparatus comprises a grasp module to come in contact with the edge portion of the substrate and thereby grasp the substrate, a suction module to attract the portion to be plated of the substrate by suction to hold the portion to be plated, and a protrusion provided at a position corresponding to the portion to be plated in the substrate, and protruding toward the substrate to be held by the substrate holding apparatus more than the suction module.

8 Claims, 10 Drawing Sheets

(56) References Cited

U.S. PATENT DOCUMENTS

2013/0295284 A1* 11/2013 Lambert .............. B65G 49/061
    427/256
2016/0329235 A1* 11/2016 Fehkuhrer ......... H01L 21/67092
2020/0258768 A1    8/2020 Tomita

* cited by examiner

SUBSTRATE HOLDING APPARATUS

TECHNICAL FIELD

The present invention relates to a substrate holding apparatus.

BACKGROUND ART

A substrate processing apparatus that processes a substrate, such as a wafer, comprises a substrate holding apparatus that holds the substrate for transportation or the like (see PTL 1, for example). The substrate holding apparatus described in PTL 1 comprises a suction section capable of attracting a front surface or a back surface of the substrate by suction to hold the surface, and a positioning section capable of positioning the attracted substrate.

CITATION LIST

Patent Literature

PTL 1: Japanese Patent Laid-Open No. 2019-21725

SUMMARY OF INVENTION

Technical Problem

In recent years, as a substrate, a substrate with a large dimension has sometimes been adopted. For a purpose of supporting the large substrate by attracting the substrate by suction, it is required to increase the number of suction sections, or to increase suction power in each suction section. Also, it is considered that, instead of attracting the substrate by suction, a substrate holding apparatus is in contact with an edge portion of the substrate to grasp the substrate. However, in a case where the substrate is large or soft, for example, when the substrate is transported by grasping the edge portion of the substrate, there is concern that a central area of the substrate hangs down, and a substrate surface comes in contact with the substrate holding apparatus or another component to cause damages or the like. To solve these problems, it is considered that the substrate is held by grasping the edge portion of the substrate and attracting the central area of the substrate by suction. However, in the case where the substrate is soft, when the substrate is held and transported, there is concern that the substrate undulates to come in contact with the substrate holding apparatus or another component. Furthermore, the substrate might noticeably warp. If the noticeably warping substrate is to be grasped, and attracted by suction to be held, the edge portion might not be suitably grasped. Furthermore, there is concern that a distance between the suction section and the substrate deviates from an appropriate distance and the substrate cannot be suitably attracted by suction, or that the substrate comes in contact with the suction section and the substrate is damaged.

The present invention has been developed in view of the above described situations, and an object is to suggest a substrate holding apparatus capable of appropriately holding a substrate.

Solution to Problem

According to an embodiment of the present invention, a substrate holding apparatus is suggested to hold a substrate including a portion to be plated that is exposed to a plating solution and an edge portion that is an area outside the portion to be plated. The substrate holding apparatus comprises a grasp module to come in contact with the edge portion of the substrate and thereby grasp the substrate, a suction module to attract the portion to be plated of the substrate by suction to hold the portion to be plated, and a protrusion provided at a position corresponding to the portion to be plated in the substrate, and protruding toward the substrate to be held by the substrate holding apparatus more than the suction module.

According to another embodiment of the present invention, a substrate holding apparatus is suggested to hold a substrate. The substrate holding apparatus comprises a grasp module to come in contact with an edge portion of the substrate and thereby grasp the substrate, a suction module to attract a first plate surface of the substrate by suction to hold the portion to be plated, and a protrusion provided at a position corresponding to a central side in the first plate surface away from a suction position by the suction module, and protruding toward the substrate to be held by the substrate holding apparatus more than the suction module.

DESCRIPTION OF EMBODIMENTS

Hereinafter, an embodiment of the present invention will be described with reference to drawings. However, the drawings for use are schematic views. Therefore, a size, position, shape and the like of an illustrated component may be different from a size, position, shape and the like in an actual apparatus. Furthermore, in the following description and the drawings for use in the following description, parts that may be configured identically are denoted with the same reference sign, and redundant description is omitted.

Figure 1:
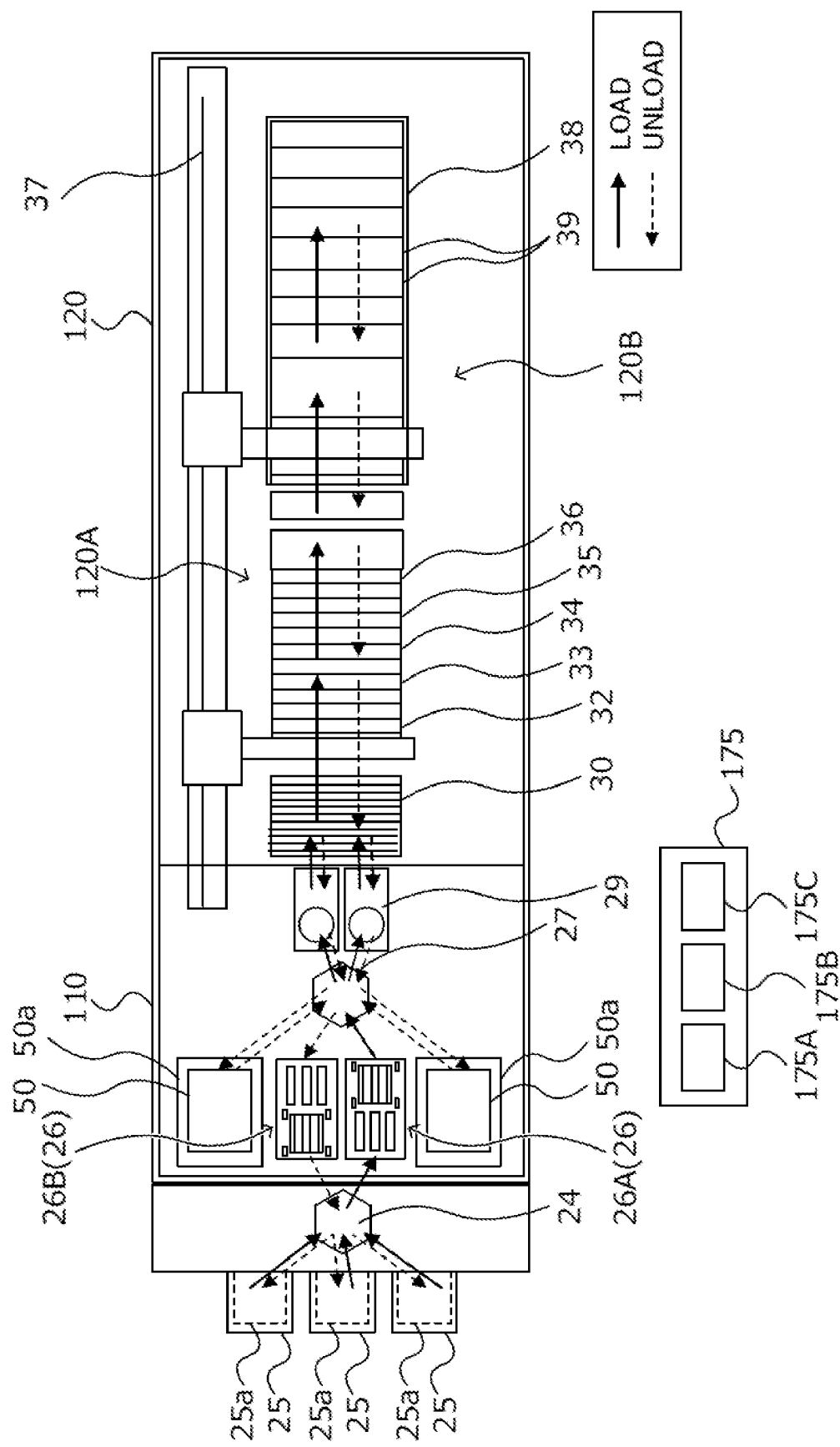
FIG. 1 is an entire arrangement view of a substrate processing apparatus according to an embodiment of the present invention.

FIG. 1 is an entire arrangement view of a plating apparatus in which a substrate holding apparatus according to an embodiment of the present invention is used. In the present embodiment, an example is described where the substrate holding apparatus is used in the plating apparatus, but the substrate holding apparatus may be used also in another substrate processing apparatus such as a polishing apparatus, a grinding apparatus, a film forming apparatus, or an etching apparatus.

A plating apparatus 100 is roughly divided into a loader/unloader 110 that loads a substrate (an object to be processed) on a substrate holder (not shown) or unloads the substrate from the substrate holder, a processor 120 that processes a substrate S. and a cleaning section 50a. The processor 120 further includes a preprocessor/postprocessor 120A that preprocesses and postprocesses the substrate, and a plating processor 120B that plates the substrate. Note that examples of the substrate S include a polygonal substrate and a round substrate. Furthermore, examples of the polygonal substrate include a glass substrate, a liquid crystal substrate, or a printed substrate having a polygonal shape such as a rectangular shape, and another polygonal object to be processed. Examples of the round substrate include a semiconductor wafer, a glass substrate, and another round object to be processed.

The loader/unloader 110 includes a substrate arrangement adjustment mechanism 26, a substrate transporter 27, and a substrate attachment/detachment mechanism 29. As an example, in the present embodiment, the loader/unloader 110 includes two substrate arrangement adjustment mechanisms 26, i.e., a substrate arrangement adjustment mechanism 26A for loading that handles the substrate S before processing, and a substrate arrangement adjustment mechanism 26B for unloading that handles the processed substrate S. In the present embodiment, the substrate arrangement adjustment mechanism 26A for loading and the substrate arrangement adjustment mechanism 26B for unloading include the same configuration, and are arranged by 180 degrees differently in orientation from each other. Note that the substrate arrangement adjustment mechanism 26 is not limited to the mechanism provided with the substrate arrangement adjustment mechanisms 26A, 26B for loading and unloading, and may be used without any distinction between the loading and the unloading. Furthermore, in the present embodiment, the loader/unloader 110 includes two substrate attachment/detachment mechanisms 29. The two substrate attachment/detachment mechanisms 29 include the same mechanism, and the mechanism that is vacant (the mechanism that does not handle the substrate S) is used. Note that each of the number of substrate arrangement adjustment mechanisms 26 to be provided and the number of substrate attachment/detachment mechanisms 29 to be provided may be one, or three or more in accordance with a space in the plating apparatus 100.

The substrate S is transported from each of a plurality of (as an example, three in FIG. 1) cassette tables 25 through a robot 24 to the substrate arrangement adjustment mechanism 26 (the substrate arrangement adjustment mechanism 26A for loading). The cassette table 25 comprises a cassette 25a that accommodates the substrate S. The cassette is, for example, a hoop. The substrate arrangement adjustment mechanism 26 is configured to adjust a position and orientation of the placed substrate S (for alignment). A substrate attachment/detachment apparatus 290 is disposed in the substrate attachment/detachment mechanism 29, and configured to attach and detach the substrate S to and from the substrate holder. Furthermore, a stocker 30 to accommodate the substrate holder is provided in a vicinity of the substrate attachment/detachment mechanism 29. A substrate transporter 27 that transports the substrate between the substrate arrangement adjustment mechanism 26 and the substrate attachment/detachment mechanism 29 is disposed therebetween. The substrate transporter 27 is configured to transport the substrate S among the substrate arrangement adjustment mechanism 26, the substrate attachment/detachment mechanism 29, and a cleaner 50.

The cleaning section 50a includes the cleaner 50 that cleans and dries the plated substrate. The substrate transporter 27 is configured to transport the plated substrate to the cleaner 50, and take the cleaned substrate from the cleaner 50. Then, the cleaned substrate is transferred to the substrate arrangement adjustment mechanism 26 (the substrate arrangement adjustment mechanism 26B for unloading) by the substrate transporter 27, and returned through the robot 24 to the cassette 25a.

The preprocessor/postprocessor 120A includes a prewet tank 32, a presoak tank 33, a prerinse tank 34, a blow tank 35, and a rinse tank 36. In the prewet tank 32, the substrate is immersed into pure water. In the presoak tank 33, an oxide film on a surface of a conductive layer such as a seed layer formed on a surface of the substrate is etched and removed. In the prerinse tank 34, the presoaked substrate is cleaned together with the substrate holder in a cleaning solution (pure water or the like). In the blow tank 35, the cleaned substrate is drained. In the rinse tank 36, the plated substrate is cleaned together with the substrate holder in the cleaning solution. Note that this configuration of the preprocessor/postprocessor 120A of the plating apparatus 100 is merely an example, the configuration of the preprocessor/postprocessor 120A of the plating apparatus 100 is not limited, and another configuration may be adopted.

The plating processor 120B includes a plurality of plating tanks 39 provided with an overflow tank 38. Each plating tank 39 accommodates one substrate therein, and the substrate is immersed into a plating solution held inside to plate the substrate surface with copper or the like. Here, there are not any special restrictions on a type of plating solution, and various plating solutions may be used in accordance with a use application.

The plating apparatus 100 includes a substrate holder transporter 37 located on a side of each unit of equipment, to transport the substrate holder together with the substrate between respective units of equipment, and in the transporter, for example, a linear motor system is adopted. The substrate holder transporter 37 is configured to transport the substrate holder among the substrate attachment/detachment mechanism 29, the stocker 30, the prewet tank 32, the presoak tank 33, the prerinse tank 34, the blow tank 35, the rinse tank 36, and the plating tank 39.

A plating system including the plating apparatus 100 configured as described above includes a controller 175 configured to control the respective components described above. The controller 175 includes a memory 175B that stores various types of setting data and various programs, a CPU 175A that executes the program stored in the memory 175B, and a control section 175C implemented by the CPU 175A that executes the program. Examples of a recording medium constituting the memory 175B may include one or more of any recording media such as a ROM, a RAM, a hard disk, a CD-ROM, a DVD-ROM, and a flexible disk. Examples of the program to be stored in the memory 175B include a program to control the substrate arrangement adjustment mechanism 26, a program to control the transport of the substrate transporter 27, a program to control attachment and detachment of the substrate to and from the substrate holder in the substrate attachment/detachment mechanism 29, a program to control the transport of the substrate holder transporter 37, and a program to control the plating in each plating tank 39. Furthermore, the controller 175 is configured to communicate with an unshown upper controller that generally controls the plating apparatus 100 and another associated device, and can exchange data with a database that the upper controller includes.

Figure 2:
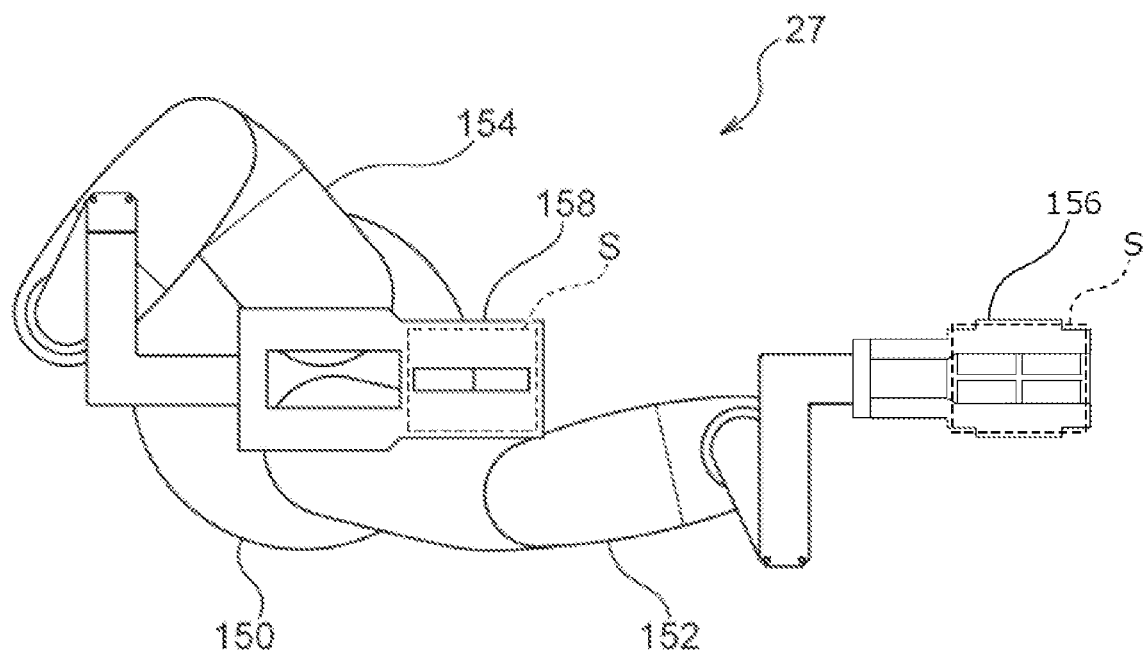
FIG. 2 is a schematic plan view showing an example of a substrate transporter disposed in a loader/unloader.
Figure 3:
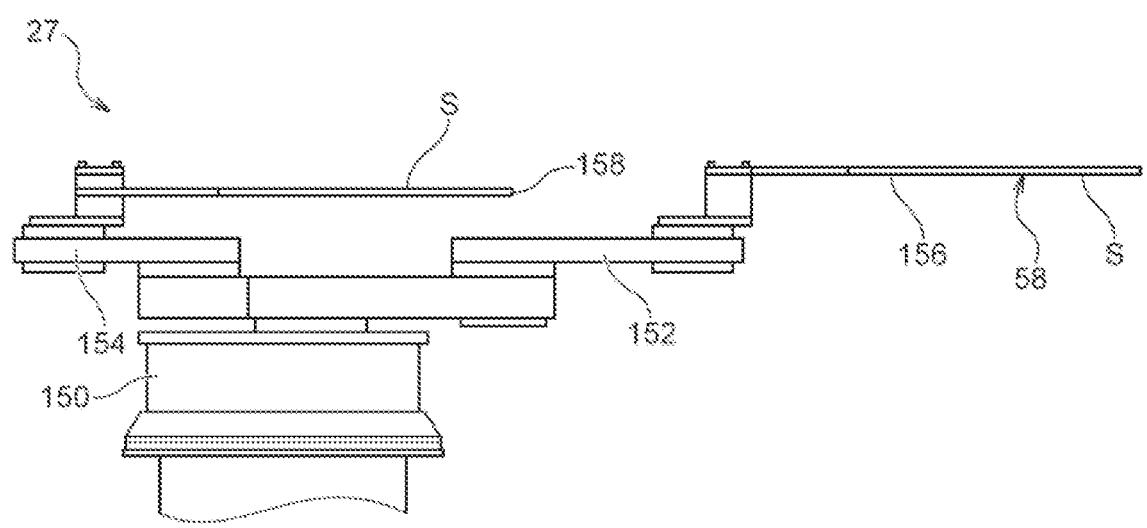
FIG. 3 is a schematic side view showing an example of the substrate transporter disposed in the loader/unloader.

FIG. 2 and FIG. 3 are views showing an example of the substrate transporter 27 disposed in the loader/unloader 110. The substrate transporter 27 includes a pair of telescopic robot arms 152, 154 arranged above a robot body 150, and robot hands 156, 158 attached to tips of the robot arms 152, 154, respectively. Furthermore, as one robot hand 156, a dry, thin and absorption type of hand (the dry hand) is used. As the other robot hand 158, a wet, thick and drop-in type of hand (the wet hand) is used.

As described above, the substrate transporter 27 transports the substrate S among the substrate arrangement adjustment mechanism 26, the substrate attachment/detachment mechanism 29 and the cleaner 50, and dry substrates and wet substrates are present in a mixed manner, so that the dry robot hand 156 and the wet robot hand 158 are adopted. That is, for the transport from the substrate arrangement adjustment mechanism 26 (the substrate arrangement adjustment mechanism 26A for loading) to the substrate attachment/detachment mechanism 29 and the transport from the cleaner 50 to the substrate arrangement adjustment mechanism (the substrate arrangement adjustment mechanism 26B for unloading), the dry robot hand 156 (a substrate holding apparatus) is used, because the substrate is completely dry. For the transport from the substrate attachment/detachment mechanism 29 to the cleaner 50, the wet robot hand 158 is used, because the substrate is wet.

First Embodiment

Figure 4:
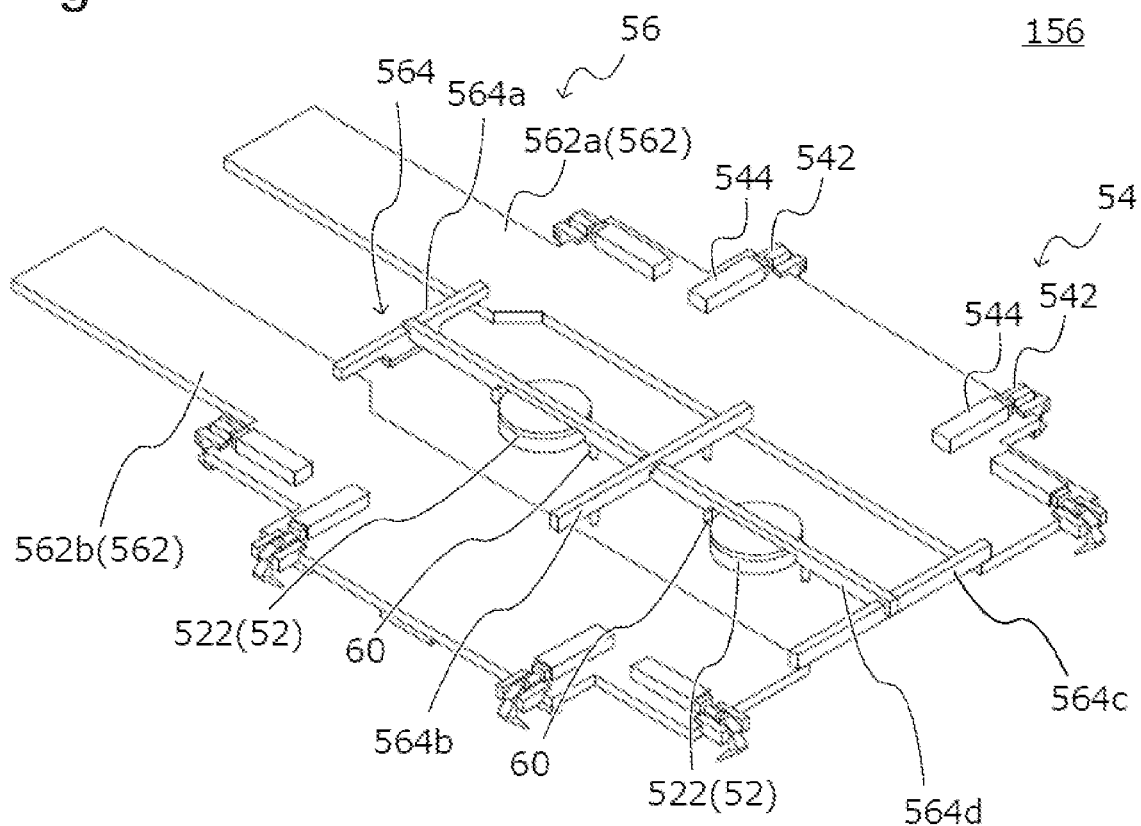
FIG. 4 is a perspective view of a robot hand of a first embodiment seen from above.
Figure 5:
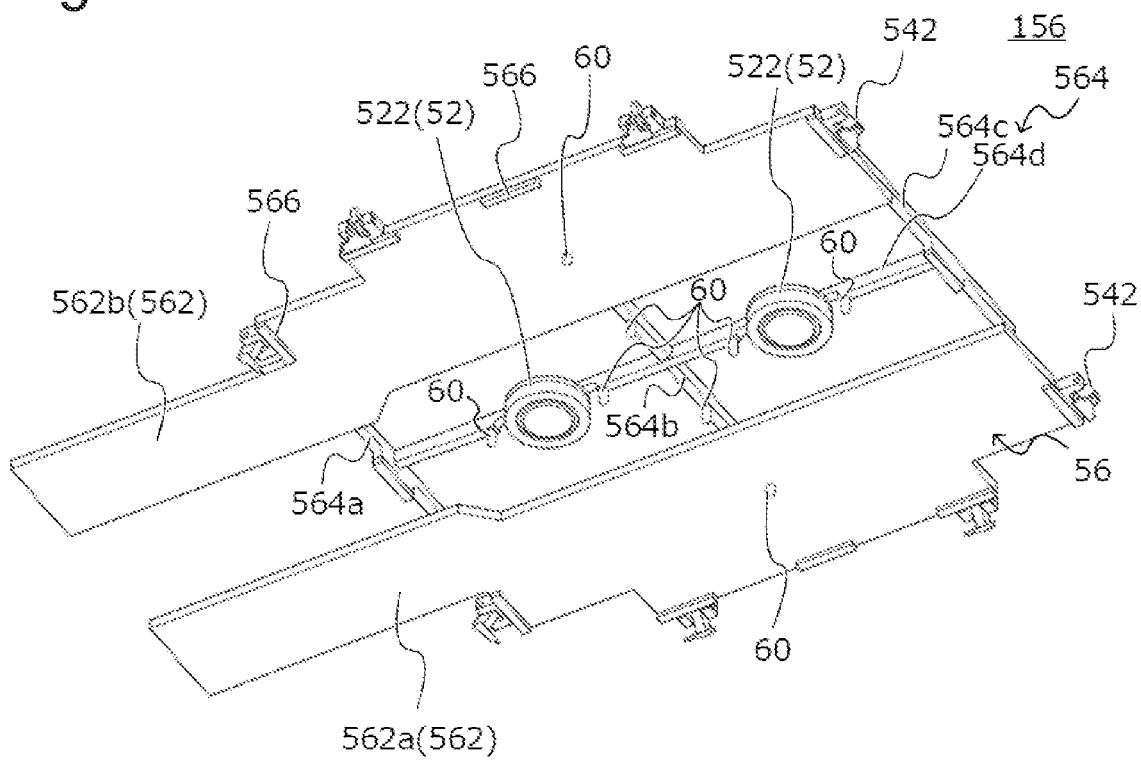
FIG. 5 is a perspective view of the robot hand of the first embodiment seen from below.

Description will be made as to the robot hand 156 in detail. Note that in the present embodiment, as an example of the substrate holding apparatus, the dry robot hand 156 will be described. However, the wet robot hand 158 may be configured in the same manner as in the robot hand 156 that will be described below. FIG. 4 is a perspective view of the robot hand 156 of the present embodiment seen from above, and FIG. 5 is a perspective view of the robot hand 156 of the present embodiment seen from below. In the present embodiment, the robot hand 156 is configured to hold the substrate S from above. However, the present embodiment is not limited to such an example, and as an example, the robot hand 156 may be configured to hold the substrate S from below. The robot hand 156 of the present embodiment includes a base body 56, a grasp module 54 to grasp the substrate S, a suction module 52 to attract a front surface or a back surface of the substrate S by suction to hold the surface, and a protrusion 60 provided on the base body 56.

The base body 56 includes a plate 562 having a plate shape and including a part to be attached to the robot arm 152, and a rod-like frame 564 connected to the plate 562. In the present embodiment, the plate 562 is divided into two members 562a, 562b for weight reduction. The two members 562a, 562b are arranged away from each other and attached to the robot arm 152. The plate 562 constitutes, as a whole, a rectangular tip with four corners being cut, and the substrate S is held facing this tip. The two members 562a, 562b of the plate 562 are connected by the frame 564. The frame 564 includes three parallel short shafts 564a to 564c connected to the two members 562a, 562b of the plate 562, respectively, and a long shaft 564d extending vertically to the short shafts 564a to 564c and connected to centers of the short shafts 564a to 564c. Note that the base body 56 is not limited to such a shape, and the shape may be selected in accordance with a shape of the substrate that is a holding target.

Figure 7:
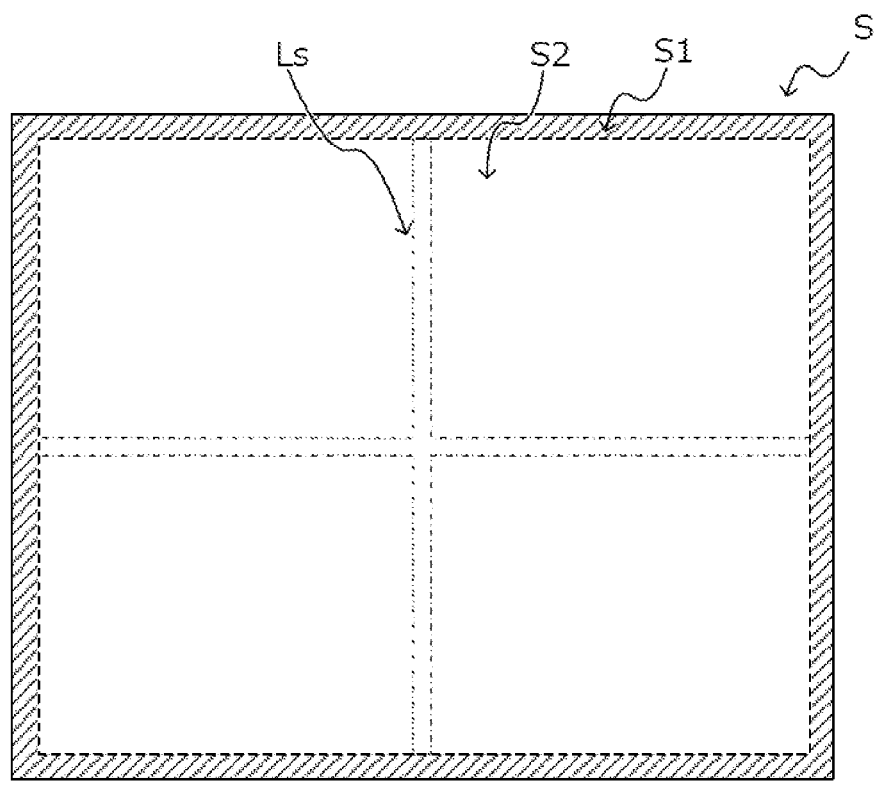
FIG. 7 is a view schematically showing a plate surface of the substrate in the present embodiment.

The grasp module 54 is configured to grasp an edge portion S1 of the substrate S, in contact with the substrate S. Here, description is made as to the substrate S in the present embodiment. FIG. 7 is a view schematically showing the surface (a first plate surface) of the substrate S in the present embodiment. Note that FIG. 7 shows a scribe line Ls of the substrate S with a dashed line. In the present embodiment, the substrate S is a polygonal substrate, and is plated in the processor 120 as described above. At this time, the substrate S held by the unshown substrate holder is placed in the plating tank 39. In general, the substrate holder holds two opposite sides or four sides of the substrate S, and during the plating, electricity is supplied to the substrate S (more specifically, to a seed layer formed on the front surface of the substrate S) through an electric contact provided in the substrate holder. The substrate S is exposed to a plating solution in an area that is not held by the substrate holder, or through an opening of the substrate holder. In FIG. 7, the edge portion S1 that is an area held by the substrate holder in the front surface (the first plate surface) of the substrate S is hatched, and a portion S2 to be plated that is disposed inside the edge portion and exposed to the plating solution is shown in white (without being hatched). In other words, the substrate S includes the portion S2 to be plated that is exposed to the plating solution, and the edge portion S1 that is an area outside the portion S2 to be plated. The portion S2 to be plated may be present only in the front surface (the first plate surface) or a back surface (a second plate surface) of the substrate S, or may be present in both the front surface (the first plate surface) and back surface (the second plate surface) of the substrate S. The edge portion S1 of the substrate S includes a peripheral edge portion of the front surface (the first plate surface) of the substrate S, a peripheral edge portion of the unshown back surface (the second plate surface), and a side surface. As described above, the grasp module 54 is configured to come in contact with the edge portion S1 and thereby grasp the substrate S.

Figure 6:
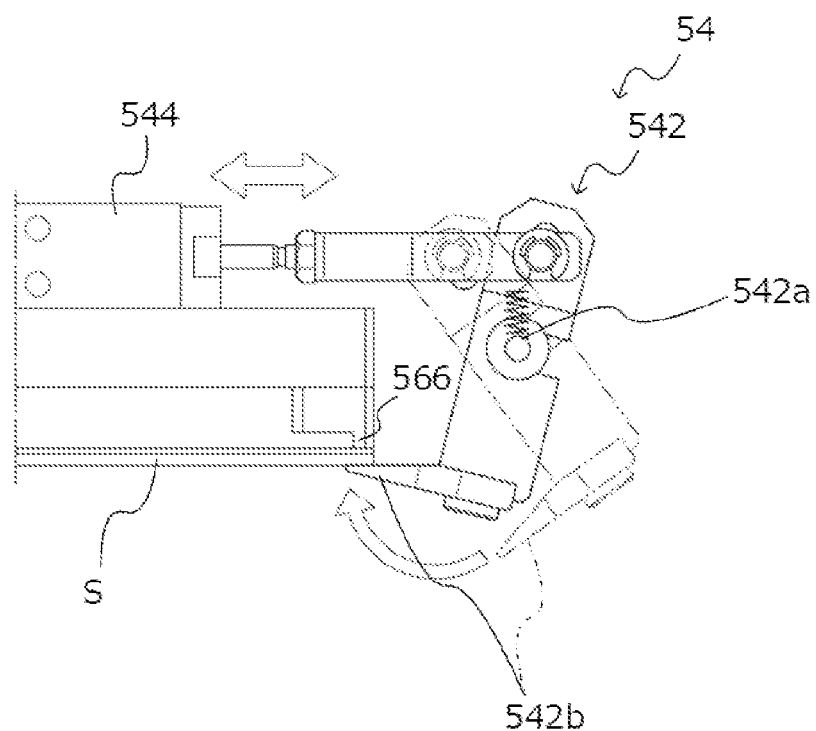
FIG. 6 is a view showing an example of grasping of a substrate by a grasp module of the first embodiment.

In the present embodiment, the grasp module 54 is attached to the base body 56 (the plate 562 in the example shown in FIG. 4 and FIG. 5). The grasp module 54 includes a hook 542 capable of grasping a surface of the edge portion S1 of the substrate S, and an actuator 544 that actuates the hook 542. As an example, a set of the hook 542 and the actuator 544 is provided at each of two positions on each of four sides of the substrate S in the example shown in FIG. 4 and FIG. 5. However, a number and positions of hooks 542 may be determined as appropriate based on a dimension or the like of the substrate S. Also, as an example, the base body 56 may be provided with a grasping protrusion 566 at a position corresponding to the edge portion S1 of the substrate S. The grasping protrusion 566 protrudes from the base body 56 toward the substrate S that is the holding target. FIG. 6 is a view showing an example of the grasping of the substrate S by the grasp module 54 of the present embodiment. As shown in FIG. 6, the hook 542 is swingable around a swing shaft 542a fixed to the base body 56. The hook 542 has one end side (an upper side in FIG. 6) connected to the actuator 544, and the other end side (a lower side in FIG. 6) provided with a claw 542b. As an example, the actuator 544 is an air cylinder that can swing the hook 542 by use of a working gas from an unshown gas source. However, the actuator 544 can be adopted in which various power sources such as a motor and a solenoid may be used. In the example shown in FIG. 6, the hook 542 swings clockwise to move the claw 542b toward the base body 56, and the base body 56 (the grasping protrusion 566) and the claw 542b accordingly come in contact with the front surface (the first plate surface) and the back surface (the second plate surface) of the edge portion S1 of the substrate S, so that the edge portion S1 of the substrate S can be grasped (see a solid line in FIG. 6). Furthermore, the hook 542 swings counterclockwise to move the claw 542b away from the base body 56, and the substrate S grasped by the grasp module 54 can be accordingly released (see a broken line in FIG. 6). Thus, the hook 542 is swung to move the claw 542b circularly, so that even if the substrate S warps, the edge portion S1 of the substrate S can be suitably grasped. However, the grasp module 54 is not limited to such a configuration as shown in FIG. 4 to FIG. 6, as long as the module is configured to come in contact with the edge portion S1 of the substrate S and thereby grasp the substrate S.

Again refer to FIG. 4 and FIG. 5. The suction module 52 is provided to hold the substrate S in non-contact with the plate surface of the substrate S, and configured to attract the portion S2 to be plated of the substrate S by suction. In the present embodiment, the suction module 52 includes Bernoulli suction pad 522. In the example shown in FIG. 4 and FIG. 5, two Bernoulli suction pads 522 are attached to the base body 56 (the frame 564). However, the suction module 52 may include one, or three or more Bernoulli suction pads. The Bernoulli suction pad 522 is connected to the unshown gas source. As an example, the Bernoulli suction pad 522 is connected to the same gas source as in the air cylinder (the actuator 544) in the grasp module 54. The Bernoulli suction pad 522 is also called Bernoulli chuck, and injects a gas to the plate surface of the substrate S, thereby attracting, by suction, the plate surface of the substrate S that receives the injected gas. Note that the suction module 52 may include a vacuum chuck connected to a negative pressure source as a mechanism that attracts the plate surface of the substrate S by suction, in place of or in addition to the Bernoulli suction pad 522.

In the base body 56, the protrusion 60 is provided at a position corresponding to the portion S2 to be plated of the substrate S. The protrusion 60 protrudes from the base body 56 toward the substrate S, to come in contact with the portion S2 to be plated of the substrate S, when the robot hand 156 holds the substrate S. Furthermore, the protrusion 60 protrudes from the base body 56 more than the Bernoulli suction pad 522 (the suction module 52), to prevent the substrate S from being brought into contact with the suction module 52. It is preferable that the protrusion 60 is fixed to the base body 56 and that a height of a tip of the protrusion from the base body 56 does not change. The tip of the protrusion 60 may be set to be as high as a tip of the grasping protrusion 566 provided at the position corresponding to the edge portion S1 of the substrate S. In other words, the tip of the protrusion 60 and the tip of the grasping protrusion 566 may be located on the same plane. Consequently, when the protrusion 60 and the grasping protrusion 566 come in contact with the substrate S, the plate surface of the substrate S can be maintained flat. It is preferable that the protrusion 60 is made of an antistatic material, and as an example, ultrahigh molecular weight polyethylene (UHMWPE) may be used. Furthermore, it is preferable that the tip of the protrusion 60 is formed to have a curved surface such as a hemispherical shape so as not to damage the plate surface of the substrate S.

Figure 8:
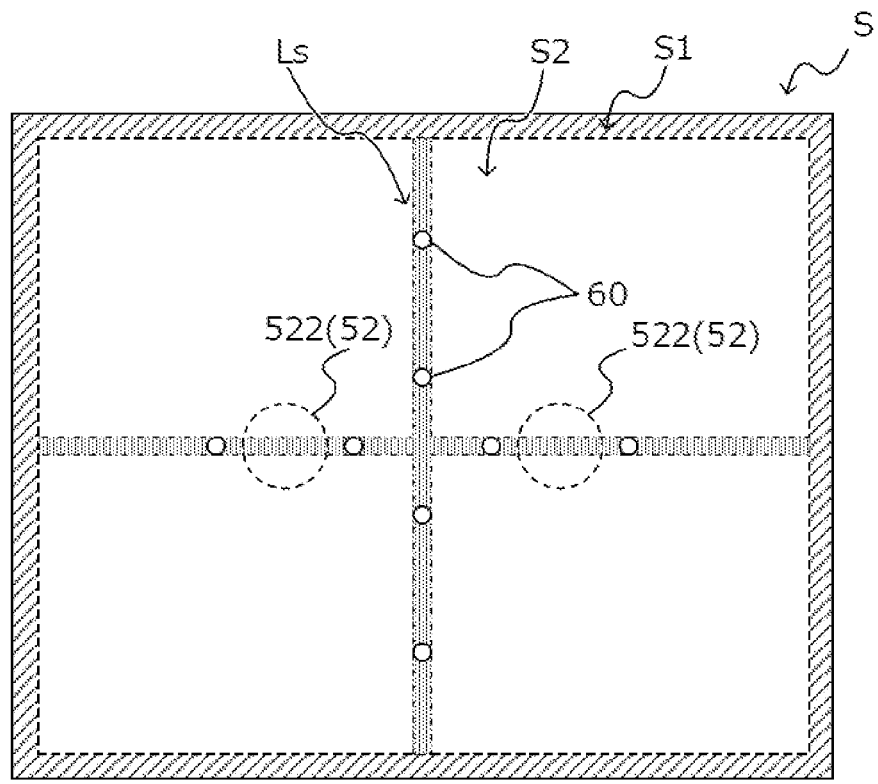
FIG. 8 is a view showing an example of a position of a protrusion to the substrate that is a holding target.

FIG. 8 is a view showing an example of a position of the protrusion 60 to the substrate S that is the holding target. In FIG. 8, hatching is applied to the edge portion S1 of the substrate S. and another type of hatching is applied to the scribe line Ls in the portion S2 to be plated. Also, FIG. 8 shows positions of protrusions 60 to the substrate S with white circles, and shows suction positions of the suction modules 52 (the Bernoulli suction pads 522) with broken lines. As shown in FIG. 5 and FIG. 8, in the present embodiment, the base body 56 is provided with a plurality of (eight in the example shown in FIG. 5 and FIG. 6) protrusions 60. At least one of the protrusions 60 or at least a part of the protrusion 60 may be provided at a position corresponding to a central side of the plate surface of the substrate S away from the suction positions (the Bernoulli suction pads 522) in the suction modules 52 that attract the portion S2 to be plated by suction. In particular, at least one of the protrusions 60 may be disposed in an area connecting the suction position in the suction module 52 to the position corresponding to the center of the plate surface of the substrate S. Note that if there are a plurality of suction positions by the suction module 52, at least one of the protrusions 60 or at least a part of the protrusion 60 may be provided at the position corresponding to the central side of the plate surface of the substrate S away from at least one of the suction positions by the suction modules 52. Alternatively, it is preferable that the protrusion 60 is provided at a position closer to the suction position (the Bernoulli suction pad 522) by the suction module 52 than to a grasp position (the hook 542) by the grasp module 54. Note that as an example, "the center" of the plate surface of the substrate S corresponds to a point at an equal distance from two opposite sides of the polygonal substrate, or a center of gravity of the plate surface of the substrate S.

Furthermore, if the substrate S includes the scribe line Ls as shown in FIG. 8, it is preferable that the protrusion 60 is disposed to come in contact with the scribe line Ls. Here, the scribe line Ls is an area that is "a clearance" provided between patterns formed in the substrate S, and is also called spacing. Thus, the protrusion 60 is disposed to come in contact with the scribe line Ls, and hence, a highly important area in the substrate S can be inhibited from being damaged. Also, the substrate S is not limited to the scribe line, and may include a comparatively important area and a comparatively less important area in the portion S2 to be plated. In the substrate S, the protrusion 60 may be provided in the base body 56 to come in contact with the comparatively less important area in the portion S2 to be plated.

Figure 9:
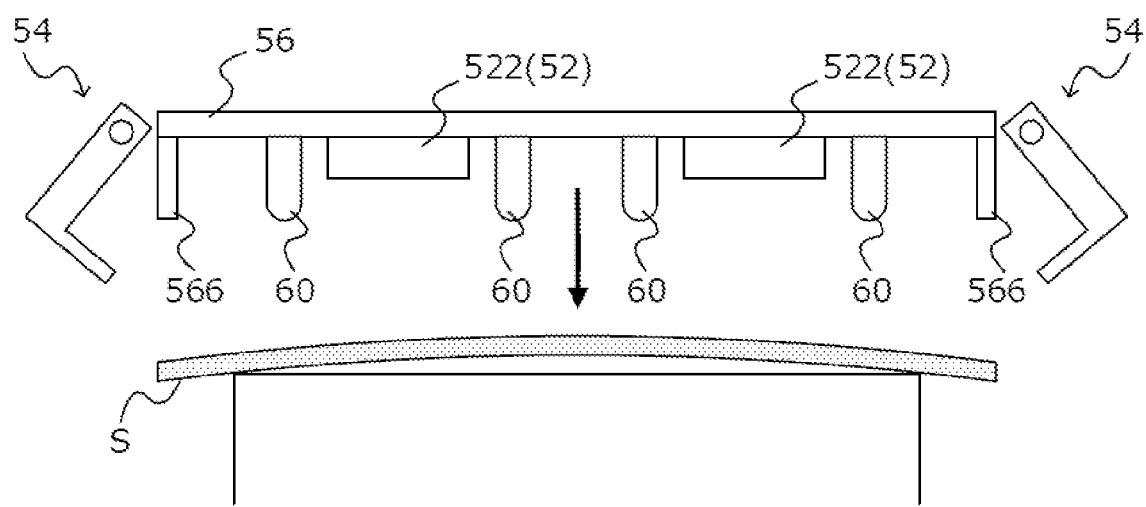
FIG. 9 is a schematic view to explain holding and transporting of the substrate by the robot hand of the present embodiment.
Figure 10:
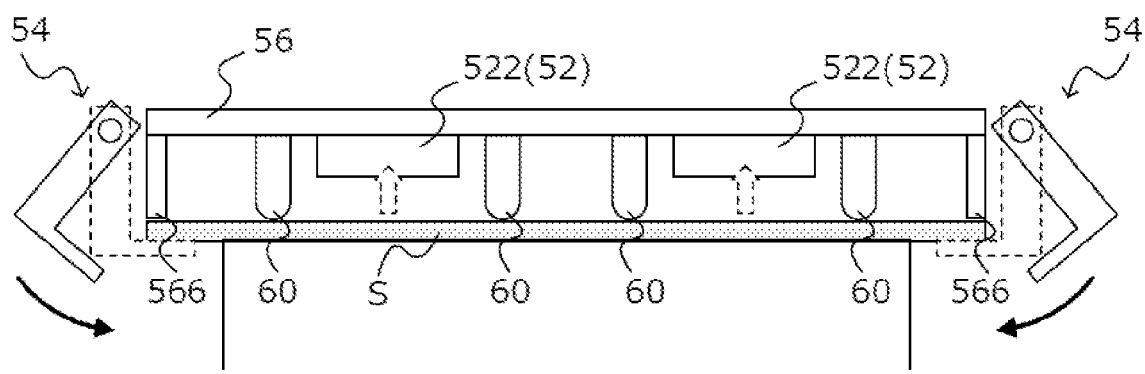
FIG. 10 is a schematic view to explain the holding and transporting of the substrate by the robot hand of the present embodiment.
Figure 11:
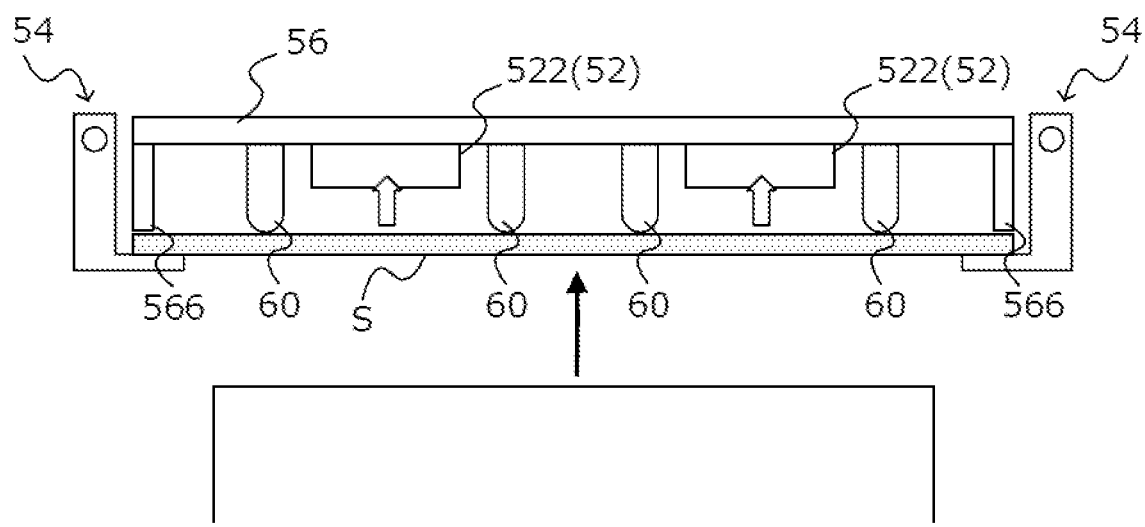
FIG. 11 is a schematic view to explain the holding and transporting of the substrate by the robot hand of the present embodiment.

One example of holding and transporting of the substrate S by use of the robot hand 156 will be described. FIG. 9 to FIG. 11 are schematic views to explain the holding and transporting of the substrate S by the robot hand 156 of the present embodiment. Note that in FIG. 9 to FIG. 11, and FIG. 12 to FIG. 14 that will be described later, for ease of understanding, the substrate S is hatched. First, as shown in FIG. 9, the robot hand 156 moves to a location where the substrate S that is the holding target is disposed (e.g., the substrate arrangement adjustment mechanism 26). The robot hand 156 of the present embodiment is configured to hold the substrate S from above, and therefore moves to the location above the substrate S. Here, in FIG. 9, as an example, the substrate S warps. Subsequently, to hold the substrate S, the robot hand 156 moves toward the substrate S (refer to an arrow in FIG. 9). At this time, as shown in FIG. 10, the robot hand 156 may be controlled to come close to a support surface until a distance to the support surface that supports the substrate S almost reaches a degree of thickness of the substrate S. The robot hand 156 comes close to the support surface, to bring the protrusion 60 and the grasping protrusion 566 of the base body 56 into contact with the substrate S. As described above, in the robot hand 156 of the present embodiment, the tip of the protrusion 60 and the tip of the grasping protrusion 566 are located on the same plane. Thus, the robot hand 156 moves until the distance to the support surface almost reaches the degree of the thickness of the substrate S, so that even if the substrate S warps, the substrate S can be flat. Subsequently, the robot hand 156 grasps the substrate S by the grasp module 54 and attracts the substrate S by suction by the suction module 52 to hold the substrate S. In the present embodiment, the grasp module 54 comes in contact with the edge portion S1 of the substrate S to grasp the substrate S, and hence, the robot hand 156 can securely hold the substrate S. Also, the suction module 52 attracts the portion S2 to be plated of the substrate S by suction, and hence, during the transporting, the portion to be plated of the substrate S can be, for example, inhibited from hanging down. Furthermore, the robot hand 156 includes the protrusion 60 protruding more than the suction module 52 at the position corresponding to the portion S2 to be plated of the substrate S, and hence, the substrate S and the suction module 52 can be maintained at an appropriate distance. Consequently, the substrate S can be prevented from being brought into contact with the suction module 52 (the Bernoulli suction pad 522), and suction power can be appropriately applied to the plate surface of the substrate S. Then, as shown in FIG. 11, the robot hand 156 can hold and transport the substrate S to a desired location.

Figure 12:
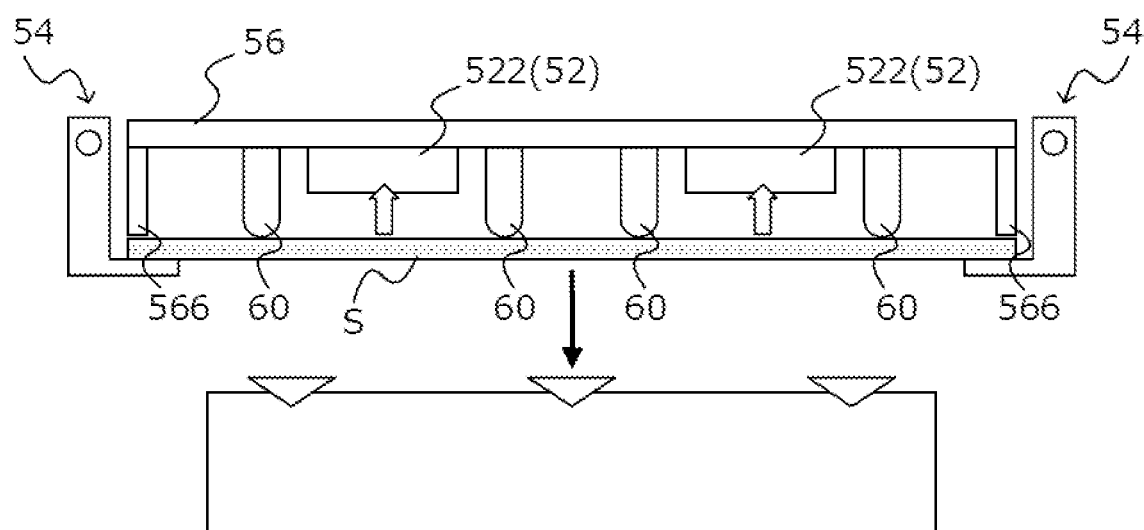
FIG. 12 is a schematic view to explain releasing of the substrate held by the robot hand of the present embodiment.
Figure 13:
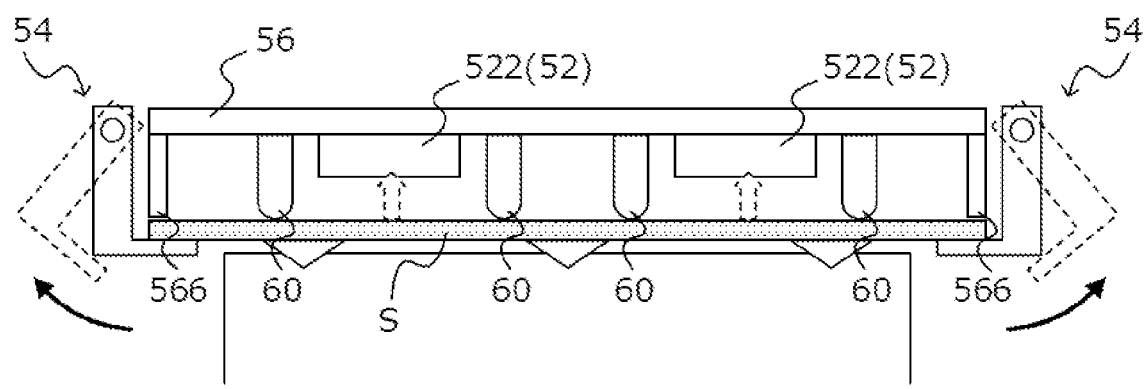
FIG. 13 is a schematic view to explain the releasing of the substrate held by the robot hand of the present embodiment.
Figure 14:
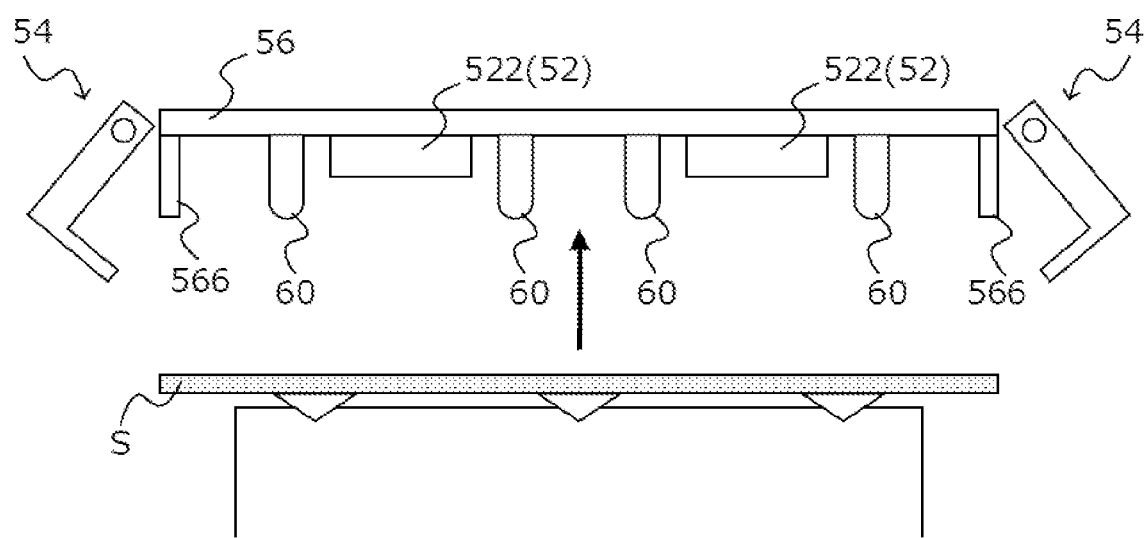
FIG. 14 is a schematic view to explain the releasing of the substrate held by the robot hand of the present embodiment.

FIG. 12 to FIG. 14 are schematic views to explain releasing of the substrate S held by the robot hand 156 of the present embodiment. As shown in FIG. 12, when the robot hand 156 holds the substrate S and moves to a transport destination (e.g., the substrate attachment/detachment mechanism 29), the robot hand moves toward a support to dispose the substrate S on the support of the transport destination (see an arrow in FIG. 12). As described above, the robot hand 156 of the present embodiment can transport the substrate S while maintaining the substrate in a flat state, and can dispose the substrate S to the support in the flat state as shown in FIG. 13. When the substrate S is disposed to the support, the robot hand 156 releases the grasping of the edge portion S1 of the substrate S by the grasp module 54 and the attraction of the substrate S by suction by the suction module 52 (see arrows in FIG. 13). Consequently, the substrate S held by the robot hand 156 is released. Then, as shown in FIG. 14, the robot hand 156 moves away from the support, thereby completing the transporting of the substrate S.

Second Embodiment

Figure 15:
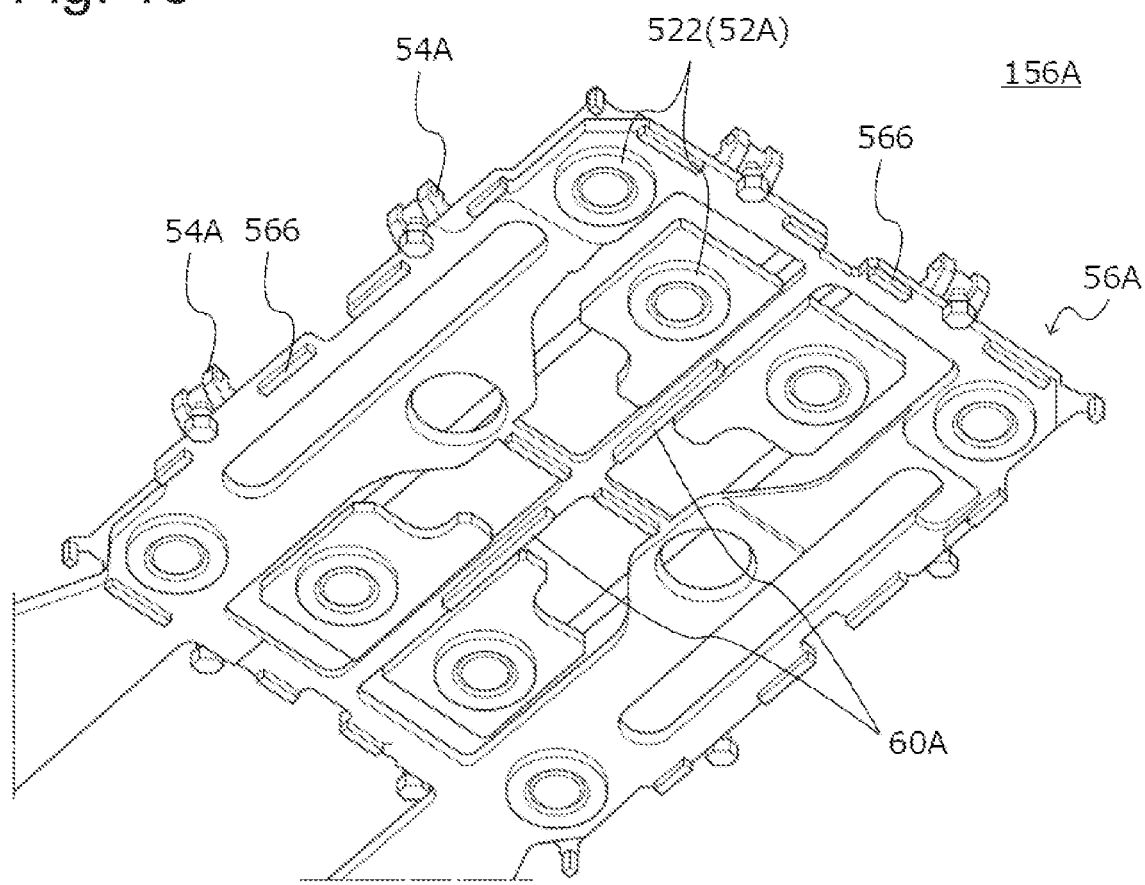
FIG. 15 is a perspective view of a robot hand of a second embodiment seen from below.

FIG. 15 is a perspective view of a robot hand (a substrate holding apparatus) 156A of a second embodiment seen from below. The robot hand 156A of the second embodiment constitutes a substrate transporter 27 in the same manner as in the robot hand 156 of the first embodiment. Note that the robot hand 156A of the second embodiment is configured to hold the polygonal substrate S described with reference to FIG. 7, in the same manner as in the robot hand 156 of the first embodiment described above. The robot hand 156A of the second embodiment includes a base body 56A, a grasp module 54A to grasp the substrate S, a suction module 52A to attract a front surface or a back surface of the substrate S by suction to hold the surface, and a protrusion 60A provided on the base body 56A.

The base body 56A is constituted of a plate-like member including an attaching part to a robot arm 152, and is formed with a plurality of openings (recesses) for weight reduction. A shape of the base body 56A may be selected as appropriate in accordance with a shape of the substrate S that is a holding target.

Figure 16:
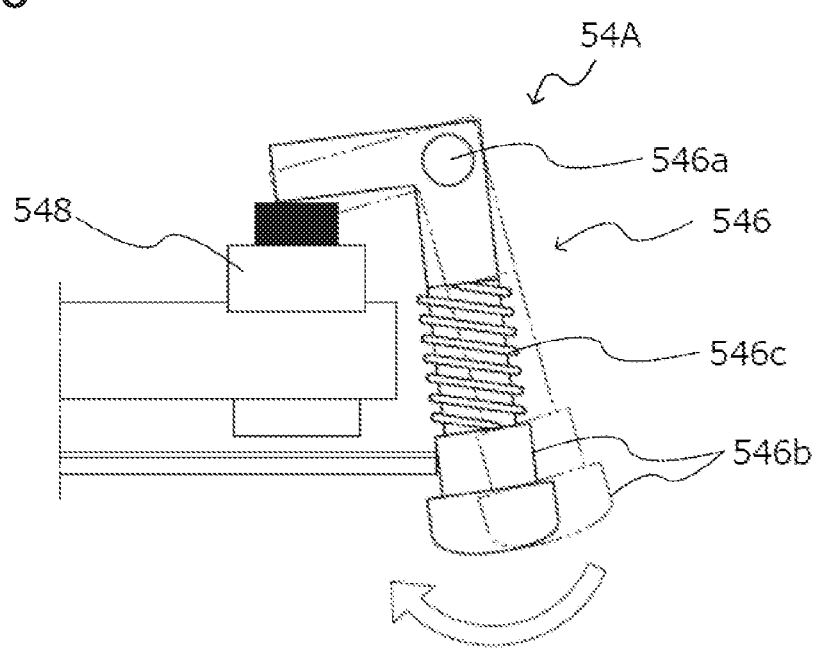
FIG. 16 is a view showing an example of grasping of a substrate by a grasp module of the second embodiment.

The grasp module 54A is attached to the base body 56A. As an example, the grasp module 54A is provided at each of two positions on each of four sides of the substrate S in an example shown in FIG. 16. However, a number and positions of grasp modules 54A may be determined as appropriate based on a dimension of the substrate S or the like. Also, in the base body 56A, a grasping protrusion 566 may be provided at a position corresponding to an edge portion S1 of the substrate S in the same manner as in the first embodiment. In the grasp module 54 of the above first embodiment, the hook 542 comes in contact with the front surface (the first plate surface) or the back surface (the second plate surface) of the edge portion S1 of the substrate S. Instead of this, the grasp module 54A of the second embodiment comes in contact with a side surface of the substrate S, to grasp the edge portion S1 of the substrate S. FIG. 16 is a view showing an example of the grasping of the substrate S by the grasp module 54A of the second embodiment. As shown in FIG. 16, the grasp module 54A includes a grip body 546 capable of grasping the edge portion S1 of the substrate S, and an actuator 548 that actuates the grip body 546. The grip body 546 is swingable around a swing shaft 546a fixed to the base body 56A. The grip body 546 has one end side (an upper side in FIG. 16) connected to the actuator 548, and the other end side (a lower side in FIG. 16) provided with a contact 546b. The contact 546b includes a flange at a tip so that the substrate S held by the robot hand 156A can be prevented from falling. Also, the contact 546b is connected to the swing shaft 546a via a spring 546c. As an example, the actuator 548 is an air cylinder that can swing the grip body 546 by use of a working gas from an unshown gas source. However, the actuator 548 can be adopted in which various power sources such as a motor and a solenoid may be used. In the example shown in FIG. 16, the grip body 546 swings clockwise to move the contact 546b inward, and the contact 546b comes in contact with a side surface of the substrate S and can grasp the edge portion S1 of the substrate S (see a solid line in FIG. 16). At this time, the grip body 546 includes the spring 546c, and can therefore hold the substrate S with appropriate force. Furthermore, the grip body 546 swings counterclockwise to move the contact 546b outward, and the substrate S grasped by the grasp module 54A can be accordingly released (see a broken line in FIG. 16). However, the grasp module 54A may only be configured to come in contact with the edge portion S1 of the substrate S and thereby grasp the substrate S, and the grasp module 54 of the first embodiment or another mechanism may be adopted.

Again refer to FIG. 15. The suction module 52A is provided to hold the substrate S in non-contact with a plate surface of the substrate S, and configured to attract a portion S2 to be plated of the substrate S by suction. In the present embodiment, the suction module 52A includes Bernoulli suction pad 522 in the same manner as in the first embodiment. In the example shown in FIG. 15, eight Bernoulli suction pads 522 are attached to the base body 56A. However, the suction module 52A may include one to seven, or nine or more Bernoulli suction pads. Also, the suction module 52A may include a vacuum chuck connected to a negative pressure source in place of or in addition to the Bernoulli suction pad 522.

In the base body 56A, the protrusion 60A is provided at a position corresponding to the portion S2 to be plated of the substrate S. The protrusion 60A protrudes from the base body 56A toward the substrate S more than Bernoulli suction pad 522 (the suction module 52A). It is preferable that a height of the protrusion 60A fixed to the base body 56A does not change. A tip of the protrusion 60A may be set to be as high as a tip of the grasping protrusion 566. It is preferable that the protrusion 60A is made of an antistatic material, and as an example, ultrahigh molecular weight polyethylene (UHMWPE) may be used.

Figure 17:
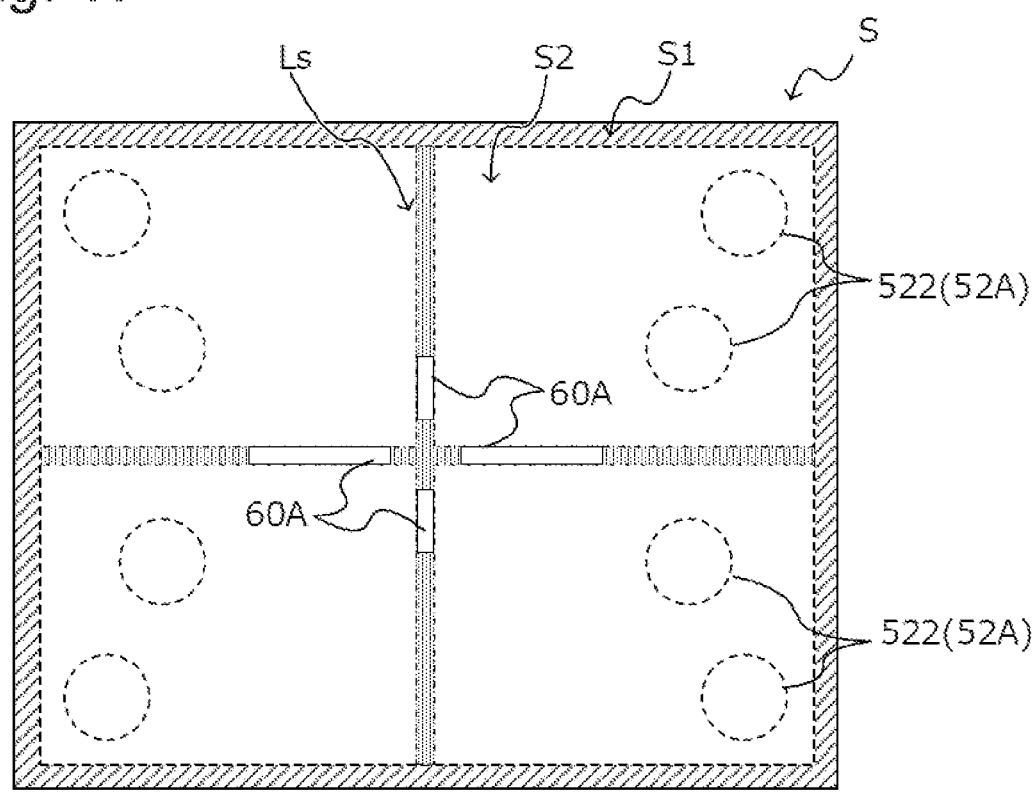
FIG. 17 is a view showing an example of a position of a protrusion to a substrate that is a holding target.

FIG. 17 is a view showing an example of the position of the protrusion 60A to the substrate S that is the holding target. In FIG. 17, hatching is applied to the edge portion S1 of the substrate S. and another type of hatching is applied to a scribe line Ls in the portion S2 to be plated. Also, FIG. 17 shows positions of protrusions 60A to the substrate S with white rectangles, and shows suction positions (the Bernoulli suction pads 522) of the suction modules 52A with broken lines. As shown in FIG. 16 and FIG. 17, in the present embodiment, the base body 56A is provided with a plurality of (four in the example shown in FIG. 16 and FIG. 17) protrusions 60A. In the second embodiment, the protrusion 60A is a rod-like member that is long along the plate surface of the substrate S. The tip of the protrusion 60A may be formed to have a curved surface, such as formed to have a semicircular cross section. Note that the shape of the protrusion 60, 60A is not limited to the shapes shown in FIG. 4, FIG. 5, FIG. 8, FIG. 16 and FIG. 17, and may be determined as appropriate based on the shape, dimension or the like of the substrate S. As shown in FIG. 17, the protrusion 60A is provided at the position corresponding to the portion S2 to be plated. Here, at least a part of the protrusion 60A may be provided at a position corresponding to a central side of the plate surface of the substrate S away from the suction position (the Bernoulli suction pad 522) in the suction module 52A. Note that if there are a plurality of suction positions by the suction module 52A, at least one (at least a part) of the protrusions 60 may be provided closer to a position corresponding to the central side of the plate surface of the substrate S than to at least one of the suction positions by the suction modules 52A. Alternatively, as shown in FIG. 17, if the substrate S includes a scribe line Ls, it is preferable that the protrusion 60A is disposed to come in contact with the scribe line Ls.

Also, in the robot hand 156A of the second embodiment, the substrate S can be held in the same manner as in the robot hand 156 of the first embodiment, and similar effects can be produced.

The present embodiments described above can be described in the following aspects.

[Aspect 1] According to aspect 1, a substrate holding apparatus is suggested to hold a substrate including a portion to be plated that is exposed to a plating solution and an edge portion that is an area outside the portion to be plated, and the substrate holding apparatus comprises a grasp module to come in contact with the edge portion of the substrate and thereby grasp the substrate, a suction module to attract the portion to be plated of the substrate by suction to hold the portion to be plated, and a protrusion provided on a base body of the substrate holding apparatus, provided at a position corresponding to the portion to be plated in the substrate, and protruding from the base body more than the suction module. According to the substrate holding apparatus of aspect 1, the substrate can be appropriately held.

[Aspect 2] According to aspect 2, a substrate holding apparatus is suggested to hold a substrate, and the substrate holding apparatus comprises a grasp module to come in contact with an edge portion of the substrate and thereby grasp the substrate, a suction module to attract a first plate surface of the substrate by suction to hold the portion to be plated, and a protrusion provided on a base body of the substrate holding apparatus, the protrusion provided at a position corresponding to a central side in the first plate surface away from a suction position by the suction module, and protruding from the base body more than the suction module. According to the substrate holding apparatus of aspect 2, the substrate can be appropriately held.

[Aspect 3] According to aspect 3, in aspect 1 or 2, the protrusion is disposed to come in contact with a scribe line of the substrate. According to aspect 3, a highly important area in the substrate can be prevented from being damaged.

[Aspect 4] According to aspect 4, in aspects 1 to 3, a tip of the protrusion has a curved surface. According to aspect 4, the substrate can be inhibited from being damaged by the protrusion.

[Aspect 5] According to aspect 5, in aspects 1 to 4, the protrusion is made of an antistatic material. According to aspect 5, the substrate can be inhibited from being damaged by the protrusion.

[Aspect 6] According to aspect 6, in aspects 1 to 5, the protrusion is provided at a position closer to a suction position by the suction module than to a grasp position by the grasp module. According to aspect 6, a distance between the suction module and the substrate can be more appropriately determined.

[Aspect 7] According to aspect 7, in aspects 1 to 6, the protrusion is fixed to a base body.

[Aspect 8] According to aspect 8, in aspects 1 to 7, the suction module is a vacuum chuck or Bernoulli chuck.

This application claims the benefit of priority based on Japanese Patent Application No. 2020-27355, filed on Feb. 20, 2020. All disclosed contents including description, claims, drawings and abstract of Japanese Patent Application No. 2020-27355 are incorporated as a whole herein by reference. All disclosure of publication of Japanese Patent Laid-Open No. 2019-21725 (PTL 1) is incorporated as a whole herein by reference.

Several embodiments of the present invention have been described above, but the above embodiments of the invention is to facilitate understanding of the present invention, and do not limit the present invention. Needless to say, the present invention may be changed or modified within the gist of the present invention, and the present invention includes equivalents. Furthermore, in a range in which at least a part of the above described problem can be solved or in a range in which at least a part of an effect is produced, any components described in claims and description can be combined or omitted.

REFERENCE SIGNS LIST 25 cassette table
25a cassette
26 substrate arrangement adjustment mechanism
27 substrate transporter 29 substrate attachment/detachment mechanism
37 substrate holder transporter
50 cleaner
52, 52A suction module
522 Bernoulli suction pad
54, 54A grasp module
542 hook
544 actuator
546 grip body
548 actuator
56, 56A base body
60, 60A protrusion
100 plating apparatus
110 loader/unloader
120 processor
156, 156A robot hand (a substrate holding apparatus)
175 controller
175A CPU
175B memory
175C control section
S substrate
S1 edge portion
S2 portion to be plated
Ls scribe line

What is claimed is:

1. A substrate holding apparatus to hold a substrate including a portion to be plated that is exposed to a plating solution and an edge portion that is an area outside the portion to be plated, the substrate holding apparatus comprising:
 a gripper configured to come in contact with the edge portion of the substrate and thereby grasp the substrate:
 a suction mechanism configured to attract the portion to be plated of the substrate by suction to hold the portion to be plated; and
 a protrusion provided at a position corresponding to the portion to be plated of the substrate, and protruding toward the substrate held by the substrate holding apparatus more than the suction mechanism protrudes toward the substrate.

2. The substrate holding apparatus according to claim 1, wherein the protrusion is disposed to come in contact with a scribe line of the substrate.

3. The substrate holding apparatus according to claim 1, wherein a tip of the protrusion has a curved surface.

4. The substrate holding apparatus according to claim 1, wherein the protrusion is made of an antistatic material.

5. The substrate holding apparatus according to claim 1, wherein the protrusion is provided at a position closer to a suction position by the suction mechanism than to a grasp position by the gripper.

6. The substrate holding apparatus according to claim 1, wherein the protrusion is fixed to a base body of the substrate holding apparatus.

7. The substrate holding apparatus according to claim 1, wherein the suction mechanism is a vacuum chuck or Bernoulli chuck.

8. A substrate holding apparatus to hold a substrate, comprising:
 a gripper configured to come in contact with an edge portion of the substrate and thereby grasp the substrate;
 a suction mechanism configured to attract a first plate surface of the substrate by suction to hold the first plate surface; and
 a protrusion provided at a position corresponding to a central side in the first plate surface away from a suction position by the suction mechanism, and protruding toward the substrate held by the substrate holding apparatus more than the suction mechanism protrudes toward the substrate.

* * * * *